US012640532B2

(12) United States Patent
Fujimaki

(10) Patent No.: US 12,640,532 B2
(45) Date of Patent: May 26, 2026

(54) PULSE STRETCHER AND ELECTRONIC DEVICE MANUFACTURING METHOD

(71) Applicant: Gigaphoton Inc., Tochigi (JP)

(72) Inventor: Yousuke Fujimaki, Oyama (JP)

(73) Assignee: Gigaphoton Inc., Tochigi (JP)

( * ) Notice: Subject to any disclaimer, the term of this patent is extended or adjusted under 35 U.S.C. 154(b) by 104 days.

(21) Appl. No.: 18/631,098

(22) Filed: Apr. 10, 2024

(65) Prior Publication Data

US 2024/0258757 A1    Aug. 1, 2024

Related U.S. Application Data

(63) Continuation of application No. PCT/JP2021/043040, filed on Nov. 24, 2021.

(51) Int. Cl.
*H01S 3/00* (2006.01)
*G02B 17/06* (2006.01)
*G03F 7/00* (2006.01)

(52) U.S. Cl.
CPC ........ *H01S 3/0057* (2013.01); *G02B 17/0647* (2013.01); *G03F 7/70025* (2013.01); *G03F 7/70041* (2013.01)

(58) Field of Classification Search
CPC .... H01S 3/0057; H01S 3/005; G03F 7/70025; G03F 7/70041
See application file for complete search history.

(56) References Cited

U.S. PATENT DOCUMENTS

| | | | |
|---|---|---|---|
| 7,369,597 B2 | 5/2008 | Smith et al. | |
| 2003/0189756 A1 | 10/2003 | Erbert et al. | |
| 2005/0105579 A1* | 5/2005 | Smith | G03F 7/7055 |
| | | | 372/55 |
| 2006/0216037 A1 | 9/2006 | Wiessner et al. | |

(Continued)

FOREIGN PATENT DOCUMENTS

| | | | | | |
|---|---|---|---|---|---|
| CN | 109672079 A | * | 4/2019 | ............... | H01S 3/10 |
| DE | 102008036572 B4 | * | 12/2013 | ........... | G02B 17/004 |
| JP | 2009-532864 A | | 9/2009 | | |

(Continued)

OTHER PUBLICATIONS

Machine translation of DE-102008036572-B4 (Year: 2008).*

(Continued)

*Primary Examiner* — Steven H Whitesell
(74) *Attorney, Agent, or Firm* — Studebaker Brackett PLLC

(57) ABSTRACT
A pulse stretcher includes a beam splitter splitting pulse laser light into two beams of pulse laser light, first concave mirrors arranged side by side in a predetermined direction, and second concave mirrors arranged side by side in the predetermined direction as having the same number as the first concave mirrors and facing the first concave mirrors, respectively. One beam of pulse laser light split by the beam splitter travels to one first concave mirror among the first concave mirrors and is reflected alternately by the first concave mirrors and the second concave mirrors 12 times or more as even number times to return to the beam splitter. A number of overlapping of the one beam at each of concentration points where at least part of the one beam of pulse laser light overlaps at beam waists of the one beam is two.

11 Claims, 8 Drawing Sheets

(56)    References Cited

U.S. PATENT DOCUMENTS

2007/0237192  A1    10/2007  Das et al.
2018/0019141  A1     1/2018  Ohkubo et al.

FOREIGN PATENT DOCUMENTS

WO       2016/147308  A1    9/2016
WO       2021/076658  A1    4/2021

OTHER PUBLICATIONS

Machine translation of CN-109672079-A (Year: 2019).*
International Search Report issued in PCT/JP2021/043040; mailed Jan. 11, 2022.
Written Opinion issued in PCT/JP2021/043040; mailed Jan. 11, 2022.
"Notice of Reasons for Refusal" Office Action issued in JP 2023-563393; mailed by the Japanese Patent Office on Jun. 24, 2025.

* cited by examiner

150

53b

55c 2,10

4,8

403

401  405

53a

6

12

55d

55b

3

9

7,11

1,5

55a 55c,55d          401,403,405          55a,55b 2,6,10                                    3,7,11

4,8,12                                    1,5,9

150

53a 55b     55a 3,11

7     1

5,9

10     4     2,6     8,12

55c     55d

53b

150

423     431

3,10,11     4     7   427

1,8,12

5,9     425     2,6

55c     429     421     55d

PULSE STRETCHER AND ELECTRONIC DEVICE MANUFACTURING METHOD

CROSS-REFERENCE TO RELATED APPLICATIONS

The present application claims the benefit of International Application No. PCT/JP2021/043040, filed on Nov. 24, 2021, the entire contents of which are hereby incorporated by reference.

BACKGROUND

1. Technical Field

The present disclosure relates to a pulse stretcher and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device each have a large spectral line width of about 350 pm to 400 pm in natural oscillation light. Therefore, when a projection lens is formed of a material that transmits ultraviolet rays such as KrF laser light and ArF laser light, there is a case in which chromatic aberration occurs. As a result, the resolution may decrease. Then, a spectral line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectral line width. In the following, a gas laser device with a narrowed spectral line width is referred to as a line narrowing gas laser device.

LIST OF DOCUMENTS

Patent Documents

Patent Document 1: U.S. Pat. No. 7,369,597

SUMMARY

A pulse stretcher according to an aspect of the present disclosure includes a beam splitter configured to split pulse laser light into two beams of pulse laser light; a plurality of first concave mirrors arranged side by side in a predetermined direction; and a plurality of second concave mirrors arranged side by side in the predetermined direction as having the same number as the first concave mirrors and facing the first concave mirrors, respectively. Here, one beam of pulse laser light split by the beam splitter travels to one first concave mirror among the plurality of first concave mirrors and is reflected alternately by the first concave mirrors and the second concave mirrors 12 times or more as even number times to return to the beam splitter. A number of overlapping of the one beam of pulse laser light at each of a plurality of concentration points where at least part of the one beam of pulse laser light overlaps at beam waists of the one beam of pulse laser light is two.

A pulse stretcher according to an aspect of the present disclosure includes a beam splitter configured to split pulse laser light into two beams of pulse laser light; a plurality of first concave mirrors arranged side by side in a predetermined direction; and a plurality of second concave mirrors arranged side by side in the predetermined direction as having the same number as the first concave mirrors and facing the first concave mirrors, respectively. Here, one beam of pulse laser light split by the beam splitter travels to one first concave mirror among the plurality of first concave mirrors and is reflected alternately by the first concave mirrors and the second concave mirrors 12 times or more as even number times to return to the beam splitter. The first concave mirrors or the second concave mirrors are shifted about an axis perpendicular to the predetermined direction so that beam waists of the one beam of pulse laser light are shifted from each other.

An electronic device manufacturing method according to an aspect of the present disclosure includes generating laser light using a gas laser device including a pulse stretcher, outputting the laser light to an exposure apparatus, and exposing a photosensitive substrate to the laser light in the exposure apparatus to manufacture an electronic device. Here, the pulse stretcher includes a beam splitter configured to split pulse laser light into two beams of pulse laser light; a plurality of first concave mirrors arranged side by side in a predetermined direction; and a plurality of second concave mirrors arranged side by side in the predetermined direction as having the same number as the first concave mirrors and facing the first concave mirrors, respectively. One beam of pulse laser light split by the beam splitter travels to one first concave mirror among the plurality of first concave mirrors and is reflected alternately by the first concave mirrors and the second concave mirrors 12 times or more as even number times to return to the beam splitter. A number of overlapping of the one beam of pulse laser light at each of a plurality of concentration points where at least part of the one beam of pulse laser light overlaps at beam waists of the one beam of pulse laser light is two.

BRIEF DESCRIPTION OF THE DRAWINGS

Embodiments of the present disclosure will be described below merely as examples with reference to the accompanying drawings.

DESCRIPTION OF EMBODIMENTS

Figure 1:
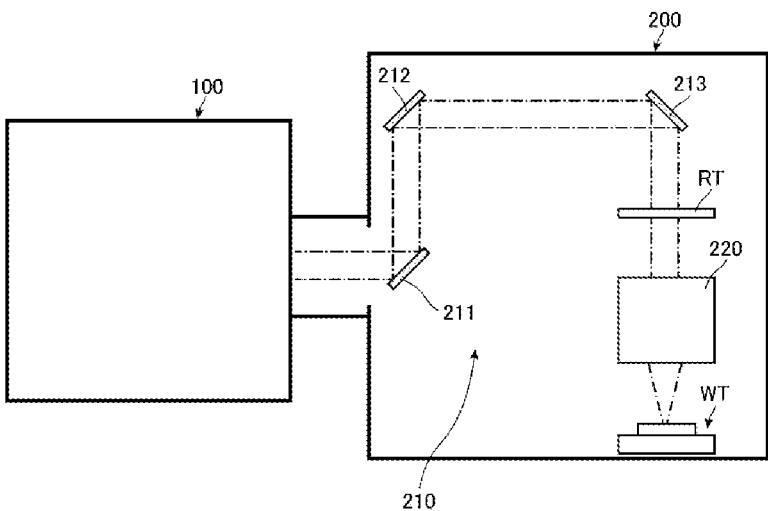
FIG. 1 is a schematic diagram showing a schematic configuration example of an entire electronic device manufacturing apparatus.

1. Description of electronic device manufacturing apparatus used in exposure process for electronic device
2. Description of gas laser device of comparative example
  2.1 Configuration
  2.2 Operation
  2.3 Problem
3. Description of pulse stretcher of first embodiment
  3.1 Configuration
  3.2 Operation
  3.3 Effect
4. Description of pulse stretcher of second embodiment
  4.1 Configuration
  4.2 Operation
  4.3 Effect
5. Description of pulse stretcher of third embodiment
  5.1 Configuration
  5.2 Operation
  5.3 Effect
6. Description of pulse stretcher of fourth embodiment
  6.1 Configuration
  6.2 Effect Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. Description of Electronic Device Manufacturing Apparatus Used in Exposure Process for Electronic Device FIG. 1 is a schematic diagram showing a schematic configuration example of an entire electronic device manufacturing apparatus used in an exposure process for an electronic device. As shown in FIG. 1, the manufacturing apparatus used in the exposure process includes a gas laser device 100 and an exposure apparatus 200. The exposure apparatus 200 includes an illumination optical system 210 including a plurality of mirrors 211, 212, 213 and a projection optical system 220. The illumination optical system 210 illuminates a reticle pattern of a reticle stage RT with laser light incident from the gas laser device 100. The projection optical system 220 causes the laser light transmitted through the reticle to be imaged as being reduced and projected on a workpiece (not shown) arranged on a workpiece table WT. The workpiece is a photosensitive substrate such as a semiconductor wafer on which photoresist is applied. The exposure apparatus 200 synchronously translates the reticle stage RT and the workpiece table WT to expose the workpiece to the laser light reflecting the reticle pattern. Through the exposure process as described above, a device pattern is transferred onto the semiconductor wafer, thereby a semiconductor device, which is the electronic device, can be manufactured.

2. Description of Gas Laser Device of Comparative Example 2.1 Configuration

The gas laser device of a comparative example will be described. The comparative example of the present disclosure is an example recognized by the applicant as known only by the applicant, and is not a publicly known example admitted by the applicant.

Figure 2:
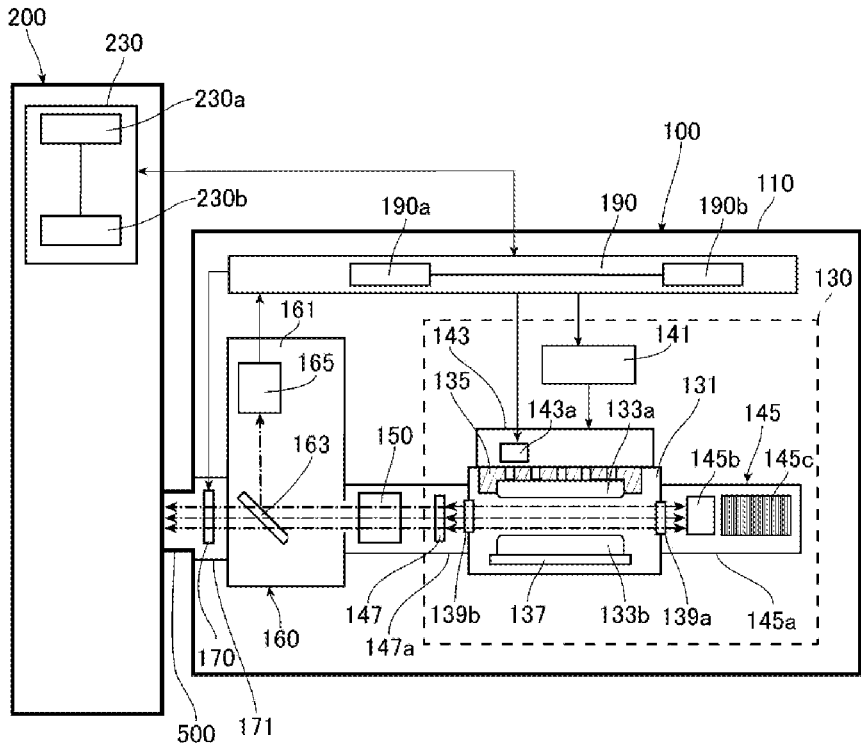
FIG. 2 is a schematic diagram showing a schematic configuration example of an entire gas laser device of a comparative example.

FIG. 2 is a schematic diagram showing a schematic configuration example of the entire gas laser device 100 of the comparative example. The gas laser device 100 is, for example, an ArF excimer laser device using a mixed gas including argon (Ar), fluorine (Fc), and neon (Ne). The gas laser device 100 outputs laser light having a center wavelength of about 193 nm. Here, the gas laser device 100 may be a gas laser device other than the ArF excimer laser device, and may be, for example, a KrF excimer laser device using a mixed gas including krypton (Kr), $F_2$, and Ne. In this case, the gas laser device 100 outputs laser light having a center wavelength of about 248 nm. The mixed gas containing Ar, $F_2$, and Ne which is a laser medium and the mixed gas containing Kr, $F_2$, and Ne which is a laser medium may be referred to as a laser gas.

The gas laser device 100 includes a housing 110, a laser oscillator 130 arranged at the internal space of the housing 110, a pulse stretcher 150, a monitor module 160, a shutter 170, and a laser processor 190 as a main configuration.

The laser oscillator 130 includes a laser chamber 131, a charger 141, a pulse power module 143, a line narrowing module 145, and an output coupling mirror 147. In FIG. 2, the internal configuration of the laser chamber 131 is shown as viewed from a direction substantially perpendicular to the travel direction of the laser light.

The laser chamber 131 includes an internal space in which light is generated by excitation of a laser medium in the laser gas. This light travels to windows 139a, 139b described later. The laser gas is supplied from a laser gas supply source (not shown) to the internal space of the laser chamber 131 through a pipe (not shown). Further, the laser gas in the laser chamber 131 is subjected to a process of removing F: gas by a halogen filter or the like, and is exhausted to the housing 110 through a pipe (not shown) by an exhaust pump (not shown).

At the internal space of the laser chamber 131, a pair of electrodes 133a, 133b are arranged to face each other and each have a longitudinal direction along the travel direction of the light. The electrodes 133a, 133b are discharge electrodes for exciting the laser medium by glow discharge. In the present example, the electrode 133a is the cathode and the electrode 133b is the anode.

The electrode 133a is supported by an electrically insulating portion 135. The electrically insulating portion 135 blocks an opening formed in the laser chamber 131. A conductive portion is (not shown) embedded in the electrically insulating portion 135, and the conductive portion applies a high voltage supplied from the pulse power module 143 to the electrode 133a. The electrode 133b is supported by a return plate 137, and the return plate 137 is connected to the inner surface of the laser chamber 131 by a wire (not shown).

The charger 141 is a DC power source device that charges a charging capacitor (not shown) in the pulse power module 143 with a predetermined voltage. The pulse power module 143 includes a switch 143a controlled by the laser processor 190. When the switch 143a is turned ON from OFF, the pulse power module 143 generates a pulse high voltage from the electric energy held in the charger 141 and applies the high voltage between the electrode 133a and the electrode 133b.

When the high voltage is applied between the electrode 133a and the electrode 133b, discharge occurs between the electrode 133a and the electrode 133b. The laser medium in the laser chamber 131 is excited by the energy of the discharge, and the excited laser medium emits light when shifting to the ground state.

The laser chamber 131 is provided with the windows 139a, 139b. The window 139a is located at one end side of the laser chamber 131 in the travel direction of the laser light, the window 139b is located at the other end side in the travel direction, and the windows 139a, 139b sandwich a space between the electrode 133a and the electrode 133b. The windows 139a, 139b are inclined at the Brewster angle with respect to the travel direction of the laser light so that P-polarized light of the laser light is suppressed from being reflected. The laser light oscillated as described later is output to the outside of the laser chamber 131 through the windows 139a, 139b. Since a pulse high voltage is applied between the electrode 133a and the electrode 133b by the pulse power module 143 as described above, the laser light is pulse laser light.

The line narrowing module 145 includes a housing 145a, a prism 145b arranged at the internal space of the housing 145a, a grating 145c, and a rotation stage (not shown). An opening is formed in the housing 145a, and the housing 145a is connected to the rear side of the laser chamber 131 through the opening.

The prism 145b expands the beam width of the light output from the window 139a and causes the light to be incident on the grating 145c. Further, the prism 145b also reduces the beam width of the reflection light from the grating 145c and returns the light to the internal space of the laser chamber 131 through the window 139a. The prism 145b is supported by the rotation stage and is rotated by the rotation stage. The incident angle of the light with respect to the grating 145c is changed by the rotation of the prism 145b. Therefore, by rotating the prism 145b, the wavelength of the light returning from the grating 145c to the laser chamber 131 via the prism 145b can be selected. Although FIG. 2 shows an example in which one prism 145b is arranged, at least one prism may be arranged.

The surface of the grating 145c is configured of a material having a high reflectance, and a large number of grooves are formed on the surface at predetermined intervals. The cross sectional shape of each groove is, for example, a right triangle. The light incident on the grating 145c from the prism 145b is reflected by these grooves and diffracted in a direction corresponding to the wavelength of the light. The grating 145c is arranged in the Littrow arrangement, which causes the incident angle of the light incident on the grating 145c from the prism 145b to coincide with the diffraction angle of the diffracted light having a desired wavelength. Thus, light having a wavelength close to the desired wavelength returns into the laser chamber 131 via the prism 145b.

The output coupling mirror 147 is arranged at the internal space of the optical path pipe 147a connected to the other end side of the laser chamber 131, and faces the window 139b. The output coupling mirror 147 transmits a part of the laser light output from the window 139b toward the pulse stretcher 150, and reflects another part of the laser light to return to the internal space of the laser chamber 131 through the window 139b. Thus, the grating 145c and the output coupling mirror 147 configure a Fabry-Perot laser resonator, and the laser chamber 131 is arranged on the optical path of the laser resonator.

The pulse stretcher 150 is arranged between the output coupling mirror 147 and the monitor module 160 at the internal space of the optical path pipe 147a. The pulse stretcher 150 stretches the pulse width of the laser light from the output coupling mirror 147, and outputs the laser light having the stretched pulse width toward the monitor module 160. In FIG. 2, the pulse stretcher 150 is shown in a simplified manner, and the configuration of the pulse stretcher 150 will be described later. An amplifier may be arranged between the pulse stretcher 150 and the output coupling mirror 147 of the laser oscillator 130, and the laser light output from the output coupling mirror 147 may be amplified by the amplifier and travels to the pulse stretcher 150.

The monitor module 160 is arranged on the optical path of the laser light output from the pulse stretcher 150. The monitor module 160 includes a housing 161, and a beam splitter 163 and an optical sensor 165 arranged at the internal space of the housing 161. An opening is formed in the housing 161, and the internal space of the housing 161 communicates with the internal space of the optical path pipe 147a through the opening.

The beam splitter 163 transmits a part of the laser light output from the pulse stretcher 150 toward the shutter 170, and reflects another part of the laser light toward a light receiving surface of the optical sensor 165. The optical sensor 165 measures an energy E of the laser light incident on the light receiving surface. The optical sensor 165 outputs a signal indicating the measured energy E to the laser processor 190.

The laser processor 190 of the present disclosure is a processing device including a storage device 190a in which a control program is stored and a central processing unit (CPU) 190b that executes the control program. The laser processor 190 is specifically configured or programmed to perform various processes included in the present disclosure.

The laser processor 190 controls the entire gas laser device 100. The laser processor 190 transmits and receives various signals to and from an exposure processor 230 of the exposure apparatus 200. For example, the laser processor 190 receives a later-described light emission trigger Tr and a later-described target energy Et from the exposure processor 230. The target energy Et is a target value of the energy of the laser light used in the exposure process. The laser processor 190 controls the charge voltage of the charger 141 based on the energy E and the target energy Et received from the optical sensor 165 and the exposure processor 230. By controlling the charge voltage, the energy of the laser light is controlled. Further, the laser processor 190 transmits a command signal of ON or OFF of the switch 143a to the pulse power module 143. The laser processor 190 is electrically connected to the shutter 170 and controls opening and closing of the shutter 170.

The laser processor 190 closes the shutter 170 until a difference ΔE between the energy E received from the monitor module 160 and the target energy Et received from the exposure processor 230 falls within an allowable range. When the difference ΔE falls within the allowable range, the laser processor 190 transmits, to the exposure processor 230, a reception preparation completion signal indicating that exposure preparation of the light emission trigger Tr is completed. The exposure processor 230 transmits a signal indicating the light emission trigger Tr to the laser processor 190 when receiving the reception preparation completion signal, and the laser processor 190 opens the shutter 170 when receiving the signal indicating the light emission trigger Tr. The light emission trigger Tr is defined by a predetermined repetition frequency f and a predetermined number of pulses P of the laser light, is a timing signal for the exposure processor 230 to cause the laser oscillator 130 to perform laser oscillation, and is an external trigger. The repetition frequency f of the laser light is, for example, 1 kHz or more and 10 kHz or less.

The shutter 170 is arranged on the optical path of the laser light transmitted through the beam splitter 163 of the monitor module 160 and having passed through an opening formed on the side of the housing 161 opposite to the side to which the optical path pipe 147a is connected. The shutter 170 is arranged at the internal space of the optical path pipe 171. The optical path pipe 171 is connected to the housing 161 to surround the opening and is in communication with the housing 161. The internal spaces of the optical path pipe 171 and the optical path pipe 147a and the internal spaces of the housing 161 and the housing 145a are supplied and filled with a purge gas. The purge gas includes an inert gas such as nitrogen (Ne). The purge gas is supplied from a purge gas supply source (not shown) through a pipe (not shown). The optical path pipe 171 is in communication with the exposure apparatus 200 through the opening of the housing 110 and an optical path pipe 500 connecting the housing 110 and the exposure apparatus 200. The laser light having passed through the shutter 170 enters the exposure apparatus 200.

The exposure processor 230 of the present disclosure is a processing device including a storage device 230a in which a control program is stored and a CPU 230b which executes the control program. The exposure processor 230 is specifically configured or programmed to perform various processes included in the present disclosure. Further, the exposure processor 230 controls the entire exposure apparatus 200.

Figure 3:
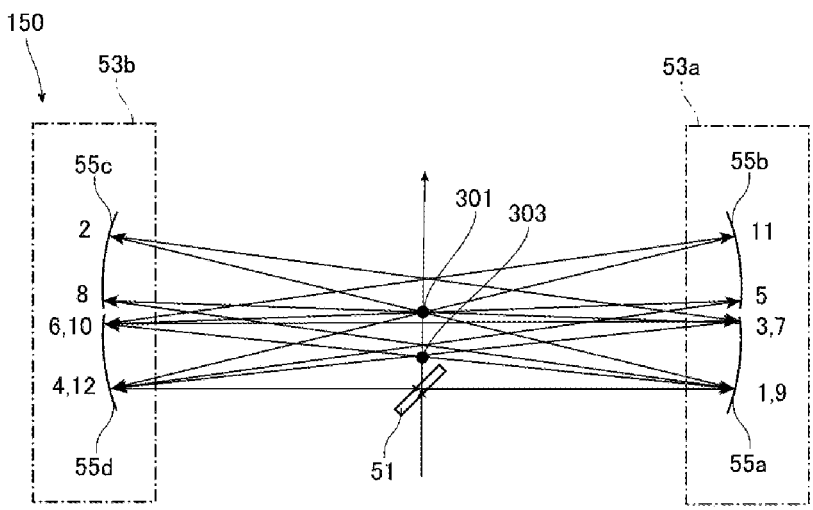
FIG. 3 is a diagram showing a schematic configuration example of a pulse stretcher of a comparative example.

FIG. 3 is a diagram showing a schematic configuration example of a pulse stretcher 150 of the comparative example. The pulse stretcher 150 includes a beam splitter 51, a first mirror unit 53a, and a second mirror unit 53b.

The beam splitter 51 is arranged on the optical path of the laser light transmitted through the output coupling mirror 147. The beam splitter 51 splits the laser light traveling to the beam splitter 51 into two beams of laser light, reflects one beam of laser light toward the first mirror unit 53a, and transmits the other beam of laser light toward the beam splitter 163.

The first mirror unit 53a includes a plurality of first concave mirrors, and the second mirror unit 53b includes the same number of second concave mirrors as the plurality of first concave mirrors. In FIG. 3, two concave mirrors 55a,

55b are shown as the first concave mirrors, and two concave mirrors 55c, 55d are shown as the second concave mirrors.

In the mirror units 53a, 53b, the concave mirrors 55a, 55b are arranged side by side in a predetermined direction, and the concave mirrors 55c, 55d are also arranged side by side in a predetermined direction, that is, a direction in which the concave mirrors 55a, 55b are arranged side by side. The concave mirror 55a is arranged on a side opposite to the concave mirror 55d with respect to the beam splitter 51 and faces the concave mirror 55d. The concave mirror 55b faces the concave mirror 55c. Thus, the concave mirrors 55a, 55b individually face the concave mirrors 55c, 55d. The beam splitter 51 and the concave mirrors 55a to 55d arranged in this manner configure a delay optical path that stretches the pulse width of the laser light.

In FIG. 3, reflection points of the laser light in the concave mirrors 55a to 55d are shown as reflection points 1 to 12. In the pulse stretcher 150, a part of the laser light is reflected by the beam splitter 51, travels toward the concave mirror 55a, is reflected alternately by the first concave mirrors and the second concave mirrors as traveling in order via the reflection points 1 to 12, and returns to the beam splitter 51 after the reflection point 12.

The reflection points 1, 3, 7, 9 are located on the concave mirror 55a, the reflection points 5, 11 are located on the concave mirror 55b, the reflection points 2, 8 are located on the concave mirror 55c, and the reflection points 4, 6, 10, 12 are located on the concave mirror 55d.

In the concave mirror 55a, the reflection point 1 is located at the same position as the reflection point 9, the reflection point 3 is located at the same position as the reflection point 7, and the reflection points 1, 9 are shifted from the reflection points 3, 7 in a predetermined direction and are farther from the concave mirror 55b than the reflection points 3, 7. In the concave mirror 55b, the reflection point 5 is shifted from the reflection point 11 in a predetermined direction and is closer to the concave mirror 55a than the reflection point 11. In the concave mirror 55c, the reflection point 2 is shifted from the reflection point 8 in a predetermined direction and is farther from the concave mirror 55d than the reflection point 8. Further, in the concave mirror 55d, the reflection point 4 is located at the same position as the reflection point 12, the reflection point 6 is located at the same position as the reflection point 10, and the reflection points 4, 12 are shifted from the reflection points 6, 10 in a predetermined direction and are farther from the concave mirror 55c than the reflection points 6, 10.

In the concave mirrors 55a, 55d, the reflection points 1, 9 face the reflection points 4, 12 and the reflection points 3, 7 face the reflection points 6, 10. In the concave mirrors 55b, 55c, the reflection point 5 faces the reflection point 8 and the reflection point 11 faces the reflection point 2.

The pulse stretcher 150 causes the laser light to travel in the pulse stretcher 150. Here, one cycle is defined as traveling of the laser light from the beam splitter 51 back to the beam splitter 51 in order via the reflection points 1 to 12. The beam splitter 51 reflects a part of the laser light reflected at the reflection point 12 of the concave mirror 55d toward the beam splitter 163, and transmits another part of the laser light toward the reflection point 1 of the concave mirror 55a. Thus, in the pulse stretcher 150, the laser light is reflected 12 times alternately by the concave mirrors 55a to 55d during one cycle, and undergoes one or more circulations in the pulse stretcher 150.

2.2 Operation

Next, operation of the gas laser device 100 of the comparative example will be described.

Before the gas laser device 100 outputs the laser light, the internal space of the optical path pipes 147a, 171, 500 and the internal space of the housings 145a, 161 are filled with the purge gas from the purge gas supply source (not shown). Further, a laser gas is supplied to the internal space of the laser chamber 131 from a laser gas supply source (not shown).

Before the gas laser device 100 outputs the laser light, the laser processor 190 receives a signal indicating a target energy Et and a signal indicating a light emission trigger Tr from the exposure processor 230. Upon receiving the signal indicating the target energy Et and the signal indicating the light emission trigger Tr, the laser processor 190 closes the shutter 170 and drives the charger 141. Further, the laser processor 190 turns ON the switch 143a of the pulse power module 143. Thus, the pulse power module 143 applies a pulse high voltage from the electric energy held in the charger 141 between the electrode 133a and the electrode 133b. The high voltage causes discharge between the electrode 133a and the electrode 133b, the laser medium contained in the laser gas between the electrode 133a and the electrode 133b is brought into an excited state, and light is emitted when the laser medium returns to the ground state. The light resonates between the grating 145c and the output coupling mirror 147, and is amplified every time it passes through the discharge space at the internal space of the laser chamber 131, thereby causing laser oscillation. Then, a part of the laser light is transmitted through the output coupling mirror 147 as pulse laser light and travels to the pulse stretcher 150.

The beam splitter 51 of the pulse stretcher 150 transmits a part of the laser light transmitted through the output coupling mirror 147 toward the beam splitter 163, and reflects another part of the laser light toward the concave mirror 55a. The laser light traveling to the concave mirror 55a is reflected alternately by the first concave mirrors and the second concave mirrors, and travels in order via the reflection points 1 to 12. Then, the laser light travels from the reflection point 12 to the beam splitter 51 to undergo one circulation in the pulse stretcher 150. A part of the laser light traveling to the beam splitter 51 is reflected by the beam splitter 51 toward the beam splitter 163 to be output from the pulse stretcher 150. Further, another part of the laser light is transmitted through the beam splitter 51 and travels again toward the reflection point 1 of the concave mirror 55a to enter the second circulation.

The laser light output from the pulse stretcher 150 after undergoing one circulation in the pulse stretcher 150 is output from the pulse stretcher 150 as being delayed by a predetermined delay time from the laser light transmitted through the beam splitter 51 without traveling to the concave mirror 55a and output from the pulse stretcher 150. Further, the laser light output from the pulse stretcher 150 after undergoing two circulations in the pulse stretcher 150 is output from the pulse stretcher 150 as being delayed by the predetermined delay time from the laser light output from the pulse stretcher 150 after undergoing one circulation in the pulse stretcher 150. The intensity of the laser light decreases as the number of circulations in the pulse stretcher 150 increases. When the circulation of the laser light in the pulse stretcher 150 is repeated, the laser light subsequently output from the pulse stretcher 150 overlaps a part of the laser light output from the pulse stretcher 150 before the subsequent laser light. As a result, the laser light having the pulse width stretched to a predetermined pulse width travels to the beam splitter 163.

A part of the laser light traveling to the beam splitter 163 is reflected by the beam splitter 163 and received by the optical sensor 165. The optical sensor 165 measures the energy E of the received laser light, and outputs a signal indicating the energy E to the laser processor 190. The laser processor 190 controls the charge voltage so that the difference ΔE between the energy E and the target energy Et falls within the allowable range, and after the difference ΔE falls within the allowable range, the laser processor 190 transmits, to the exposure processor 230, the reception preparation completion signal indicating that reception preparation of the light emission trigger Tr is completed.

Upon receiving the reception preparation completion signal, the exposure processor 230 transmits the light emission trigger Tr to the laser processor 190. When the laser processor 190 opens the shutter 170 in synchronization with the reception of the light emission trigger Tr, the laser light that has passed through the shutter 170 enters the exposure apparatus 200. The laser light is, for example, pulse laser light having a center wavelength of 193 nm.

2.3 Problem

In the pulse stretcher 150 of the comparative example, the pulse laser light traveling from the concave mirrors 55c, 55d to the concave mirrors 55a, 55b is parallel light, but the pulse laser light traveling from the concave mirrors 55a, 55b to the concave mirrors 55c, 55d is concentrating light that is concentrating in the middle of the travel. Out of the concentrating light, the pulse laser light traveling from the reflection point 1 to the reflection point 2, from the reflection point 5 to the reflection point 6, from the reflection point 7 to the reflection point 8, and from the reflection point 11 to the reflection point 12 will be described. In the pulse stretcher 150 of the comparative example, a concentration point 301 where overlapping of at least part of the pulse laser light occurs at each beam waist of the pulse laser light is formed. The concentration point 301 is located between the first mirror unit 53a and the second mirror unit 53b. Further, a concentration point 303 is also formed with the pulse laser light traveling from the reflection point 3 to the reflection point 4 and from the reflection point 9 to the reflection point 10 out of the concentrating light. Thus, in the pulse stretcher 150 of the comparative example, two concentration points 301, 303 are formed, and the number of overlapping beams of the pulse laser light at each of the concentration points 301, 303 are four and two, respectively. Due to formation of the concentration points 301, 303, even when a shift of the pulse laser light entering the pulse stretcher 150 or an alignment shift of the concave mirrors 55a to 55d occurs, a change in characteristics of the pulse laser light output from the gas laser device 100 is suppressed. Examples of such a change in characteristics include a deviation in pointing, which is a traveling direction of the pulse laser light.

Incidentally, as the number of reflections at the concave mirrors 55a to 55d increases, the number of overlapping of the pulse laser light per concentration point increases. The larger the number of overlapping of the pulse laser light is, the higher the energy density of the pulse laser light at the concentration point is, and the higher the energy of the pulse laser light absorbed by oxygen is. Consequently, the temperature in the vicinity of the concentration point of the pulse stretcher 150 may increase, and plasma may be generated due to the temperature increase. Due to the temperature increase and the generation of the plasma, a refractive index distribution is generated in the pulse stretcher 150, and the wavefront of the pulse laser light may be distorted. When the wavefront is distorted, a pointing deviation occurs, and vignetting of the pulse laser light may occur in any of the optical systems in the exposure apparatus 200, and the energy of the pulse laser light may fluctuate. Due to fluctuation of the energy, processing accuracy of a workpiece in the exposure apparatus 200 may be reduced. That is, there is a concern that the pulse laser light satisfying the performance required by the exposure apparatus 200 is not output, and the reliability of the gas laser device 100 is decreased.

Therefore, in the following embodiments, the pulse stretcher 150 is exemplified, which can suppress a decrease in the reliability of the gas laser device 100.

3. Description of Pulse Stretcher of First Embodiment

Next, the pulse stretcher 150 of a first embodiment will be described. Any component same as that described above is denoted by an identical reference sign, and duplicate description thereof is omitted unless specific description is needed.

3.1 Configuration

Figure 4:
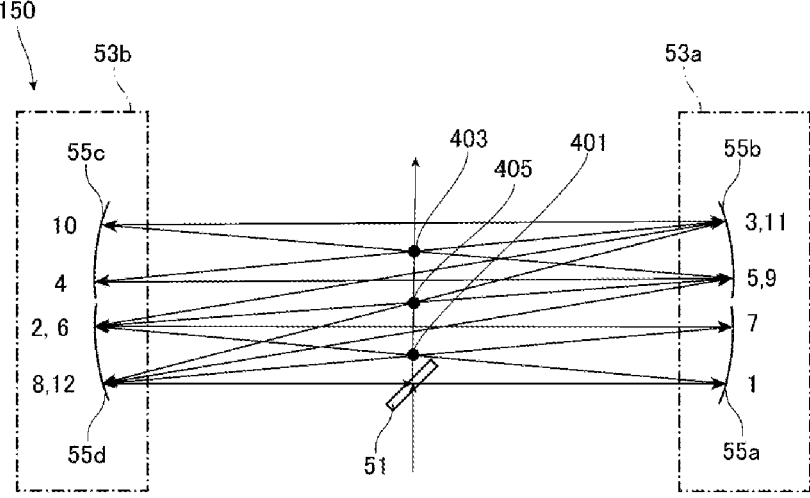
FIG. 4 is a diagram showing positions of reflection points 1 to 12 and reflection directions of laser light in the pulse stretcher of a first embodiment.

FIG. 4 is a diagram showing the positions of reflection points 1 to 12 and the reflection directions of the pulse laser light in the pulse stretcher 150 of the present embodiment.

In the pulse stretcher 150 of the present embodiment, three concentration points 401, 403, 405 are formed, and two or more of the concave mirrors 55a to 55d are shifted around an axis perpendicular to a predetermined direction as compared with the comparative example so that the number of overlapping of the pulse laser light is two at each of the concentration points 401, 403, 405. In the pulse stretcher 150 of the present embodiment, an example in which the concave mirrors 55a to 55c are shifted is shown, and the positions of the reflection points 1 to 12 in the pulse stretcher 150 and the reflection directions of the pulse laser light are different from those of the comparative example due to the shift. To avoid complication in FIG. 4, the shift of the concave mirrors 55a to 55c is not shown.

In the present embodiment, the reflection points 1, 7 are located on the concave mirror 55a, the reflection points 3, 5, 9, 11 are located on the concave mirror 55b, the reflection points 4, 10 are located on the concave mirror 55c, and the reflection points 2, 6, 8, 12 are located on the concave mirror 55d.

In the concave mirror 55a, the reflection point 1 is shifted from the reflection point 7 in a predetermined direction and is farther from the concave mirror 55b than the reflection point 7. In the concave mirror 55b, the reflection point 3 is located at the same position as the reflection point 11, the reflection point 5 is located at the same position as the t reflection point 9, and the reflection points 3, 11 are shifted from the reflection points 5, 9 in a predetermined direction and are farther from the concave mirror 55a than the reflection points 5, 9. In the concave mirror 55c, the reflection point 4 is shifted from the reflection point 10 in a predetermined direction and is closer to the concave mirror 55d than the reflection point 10. Further, in the concave mirror 55d, the reflection point 2 is located at the same position as the reflection point 6, the reflection point 8 is located at the same position as the reflection point 12, and the reflection points 2, 6 are shifted from the reflection points 8, 12 in a predetermined direction and are closer to the concave mirror 55c than the reflection points 8, 12.

In the concave mirrors 55a, 55d, the reflection point 1 faces the reflection points 8, 12 and the reflection point 7 faces the reflection points 2, 6. In the concave mirrors 55b, 55c, the reflection points 5, 9 face the reflection point 4 and the reflection points 3, 11 face the reflection point 10. When the concave mirrors 55a, 55b are viewed from the front, the reflection points 1, 3, 5, 7, 9, 11 of the concave mirrors 55a,

55b are located on a line passing through the centers of the concave mirrors 55a, 55b. Further, when the concave mirrors 55c, 55d are viewed from the front, the reflection points 2, 4, 6, 8, 10, 12 of the concave mirrors 55c, 55d are located on a line passing through the centers of the concave mirrors 55c, 55d. The reflection points 1 to 12 are located as being shifted respectively from the centers of the concave mirrors 55a to 55d where the reflection points 1 to 12 are located respectively. In the concave mirrors 55a to 55d of the present embodiment, a single plane passes through the reflection points 1 to 12. In the pulse stretcher 150 of the present embodiment, the pulse laser light is reflected once during one cycle at each of two reflection points in each of the concave mirrors 55a, 55c being one of the first concave mirrors and one of the second concave mirrors.

In the pulse stretcher 150 of the present embodiment, the pulse laser light is reflected twice during one cycle at each of two reflection points in each of the concave mirrors 55b, 55d being the other of the first concave mirrors and the other of the second concave mirrors. The pulse stretcher 150 of the present embodiment reflects the pulse laser light, alternately 12 times, by the concave mirrors 55a to 55d back to the beam splitter 51, but may reflect the pulse laser light, alternately more than 12 times being even number times, back to the beam splitter 51.

In the pulse stretcher 150 of the present embodiment, the concave mirrors 55a to 55d have the same radius of curvature R and the same diameter D. Further, the distance between the concave mirror 55a and the concave mirror 55d facing each other and the distance between the concave mirror 55b and the concave mirror 55c facing each other are a distance L. Here, R=L and L>>D are satisfied.

3.2 Operation

Next, operation of the pulse stretcher 150 of the present embodiment will be described.

Similarly to the comparative example, a part of the pulse laser light travels from the beam splitter 51 to the concave mirror 55a and is reflected alternately by the first concave mirror and the second concave mirror. Since the reflection point 1 is located on the line passing through the centers of the concave mirrors 55a, 55b as described above and is shifted from the center of the concave mirror 55a, the pulse laser light travels in order via the reflection points 1 to 12 in the first concave mirrors and the second concave mirrors. Further, since the single plane passes through the reflection points 1 to 12 as described above, the pulse laser light travels along the plane passing through the reflection points 1 to 12. Then, the pulse laser light returns from the reflection point 12 to the beam splitter 51 to undergo one circulation in the pulse stretcher 150.

In the pulse stretcher 150 of the present embodiment, at least a part of beams of the pulse laser light overlaps at the beam waist of the pulse laser light traveling from the reflection point 1 to the reflection point 2 and at the beam waist of the pulse laser light traveling from the reflection point 7 to the reflection point 8, and the concentration point 401 is formed by the overlap. Further, at least a part of beams of the pulse laser light overlaps at the beam waist of the pulse laser light traveling from the reflection point 3 to the reflection point 4 and at the beam waist of the pulse laser light traveling from the reflection point 9 to the reflection point 10, and the concentration point 403 is formed by the overlap. Further, at least a part of beams of the pulse laser light overlaps at the beam waist of the pulse laser light traveling from the reflection point 5 to the reflection point 6 and at the beam waist of the pulse laser light traveling from the reflection point 11 to the reflection point 12, and the concentration point 405 is formed by the overlap. Therefore, in the pulse stretcher 150 of the present embodiment, three concentration points 401, 403, 405 are formed, and the number of overlapping beams of the pulse laser light at each of the concentration points 401, 403, 405 is two. Since the single plane passes through the reflection points 1 to 12, the single plane passes through the concentration points 401, 403, 405.

3.3 Effect

In the pulse stretcher 150 of the present embodiment, the number of overlapping beams of the pulse laser light is two at each of the concentration points 401, 403, 405.

According to the above configuration, as compared with the concentration point 301 at which the number of overlapping beams of the pulse laser light is four, the energy density of the pulse laser light at the concentration point is decreased, and the energy of the pulse laser light absorbed by the oxygen is decreased. Consequently, the temperature rise and the generation of plasma in the vicinity of the concentration point of the pulse stretcher 150 are suppressed. According to the suppression of the above, generation of the refractive index distribution in the pulse stretcher 150 is suppressed and distortion of the wavefront of the pulse laser light can be suppressed. Therefore, the pulse laser light satisfying the performance required by the exposure apparatus 200 can be output, and a decrease in the reliability of the gas laser device 100 can be suppressed.

4. Description of Pulse Stretcher of Second Embodiment

Next, the configuration of the pulse stretcher 150 of a second embodiment will be described. Any component same as that described above is denoted by an identical reference sign, and duplicate description thereof is omitted unless specific description is needed.

4.1 Configuration

Figures 5, 6:
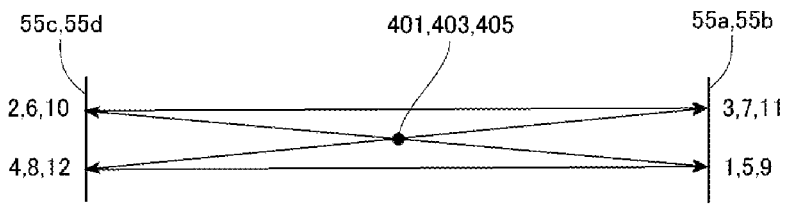
FIG. 5 is a diagram showing positions of reflection points 1 to 12 and reflection directions of the laser light in the pulse stretcher of a second embodiment.
FIG. 6 is a diagram of concave mirrors, the reflection points 1 to 12, and the reflection directions of the laser light shown in FIG. 5 along a predetermined direction.

FIG. 5 is a diagram showing the positions of reflection points 1 to 12 and reflection directions of the pulse laser light in the pulse stretcher 150 of the present embodiment. For easy viewing, FIG. 5 does not show the beam splitter 51, the pulse laser light traveling from the output coupling mirror 147 to the beam splitter 51, and the pulse laser light traveling from the beam splitter 51 to the beam splitter 163. In the pulse stretcher 150 of the present embodiment, the positions of the reflection points 1 to 12 in the pulse stretcher 150 and the reflection directions of the pulse laser light are different from those of the first embodiment.

In the present embodiment, reflection points 1, 5, 7, 11 are located on the concave mirror 55a, reflection points 3, 9 are located on the concave mirror 55b, reflection points 2, 4, 8, 10 are located on the concave mirror 55c, and reflection points 6, 12 are located on the concave mirror 55d.

In the concave mirror 55a, the reflection point 1 is located at the same position as the reflection point 5, and the reflection point 7 is located at the same position as the reflection point 11. Further, the reflection points 1, 5 are shifted from the reflection points 7, 11 in a direction perpendicular to a predetermined direction, and are separated from the concave mirror 55b by the same distance as the reflection points 7, 11.

In the concave mirror 55b, the reflection point 3 is shifted from the reflection point 9 in the direction perpendicular to the predetermined direction, and is separated from the concave mirror 55a by the same distance as the reflection point 9.

In the concave mirror 55c, the reflection point 2 is located at the same position as the reflection point 10, and the reflection point 4 is located at the same position as the reflection point 8. Further, the reflection points 2, 10 are shifted from the reflection points 4, 8 in the direction perpendicular to the predetermined direction, and are separated from the concave mirror 55d by the same distance as the reflection points 4, 8.

In the concave mirror 55d, the reflection point 6 is shifted from the reflection point 12 in the direction perpendicular to the predetermined direction, and is separated from the concave mirror 55c by the same distance as the reflection point 12.

In the concave mirrors 55a, 55d, the reflection points 1, 5 face the reflection point 12 and the reflection points 7, 11 face the reflection point 6. In the concave mirrors 55b, 55c, the reflection point 9 faces the reflection points 4, 8 and the reflection point 3 faces the reflection points 2, 10. When the concave mirrors 55a, 55b are viewed from the front, the reflection points 1, 3, 5, 7, 9, 11 of the concave mirrors 55a, 55b are shifted in the direction perpendicular to the predetermined direction from a line passing through the respective centers of the concave mirrors 55a, 55b. When the concave mirrors 55c, 55d are viewed from the front, the reflection points 2, 4, 6, 8, 10, 12 of the concave mirrors 55c, 55d are shifted in the direction perpendicular to the predetermined direction from a line passing through the respective centers of the concave mirrors 55c, 55d. The reflection points 1 to 12 are located offset respectively from the centers of the concave mirrors where the reflection points 1 to 12 are located respectively. A single plane passes through the reflection points 1, 5, 7, 11 of the concave mirror 55a and the reflection points 6, 12 of the concave mirror 55d, and a single plane passes through the reflection points 3, 9 of the concave mirror 55b and the reflection points 2, 4, 8, 10 of the concave mirror 55c. When the concave mirrors 55a, 55b are viewed along a predetermined direction, the reflection points 1, 5, 9 overlap each other, and the reflection points 3, 7, 11 overlap each other. Further, in the concave mirrors 55c, 55d, the reflection points 2, 6, 10 overlap each other, and the reflection points 4, 8, 12 overlap each other.

In the present embodiment as well, the pulse laser light is reflected alternately by the first concave mirrors and the second concave mirrors during one cycle, and travels in order via the reflection points 1 to 12. Thus, in the pulse stretcher 150 of the present embodiment, the pulse laser light is reflected once during one cycle at each of two reflection points in each of the concave mirrors 55b, 55d being one of the first concave mirrors and one of the second concave mirrors. Further, the pulse laser light is reflected twice during one cycle at each of two reflection points in each of the concave mirrors 55a, 55c being the other of the first concave mirrors and the other of the second concave mirrors. Further, as described above, the reflection points in each of the concave mirrors 55a to 55d are shifted in a direction perpendicular to the predetermined direction.

4.2 Operation

Next, operation of the pulse stretcher 150 of the present embodiment will be described.

Similarly to the pulse stretcher 150 of the first embodiment, a part of the pulse laser light travels from the beam splitter 51 to the concave mirror 55a and is reflected alternately by the first concave mirror and the second concave mirror. As described above, the reflection point 1 is shifted in the direction to perpendicular the predetermined direction from the line passing through the centers of the concave mirrors 55a, 55b. Therefore, the pulse laser light travels in order via the reflection points 1 to 12. Then, the pulse laser light returns from the reflection point 12 to the beam splitter 51 to undergo one circulation in the pulse stretcher 150.

In the pulse stretcher 150 of the present embodiment as well, similarly to the pulse stretcher 150 of the first embodiment, three concentration points 401, 403, 405 are formed, and the number of overlapping beams of the pulse laser light at each of the concentration points 401, 403, 405 is two. Unlike the first embodiment, the plane through which the reflection points 1, 7, 2, 8 pass, the plane through which the reflection points 9, 3, 10, 4 pass, and the plane through which the reflection points 5, 11, 6, 12 pass are arranged as being shifted in a predetermined direction. Therefore, the concentration points 401, 403, 405 are located at different positions in the predetermined direction.

FIG. 6 is a diagram showing the concave mirrors 55a to 55d, the reflection points 1 to 12, and the reflection directions of the pulse laser light shown in FIG. 5 along the predetermined direction. When the first mirror unit 53a and the second mirror unit 53b are viewed along the predetermined direction, two optical paths of the pulse laser light pass through the concentration points 401, 403, 405. The pulse laser light passing through the concentration points 401, 403, 405 intersects the plane where the respective centers of the concave mirrors 55a to 55d overlap, and the pulse laser light not passing through the concentration points 401, 403, 405 travels along the plane. Further, the concentration points 401, 403, 405 overlap each other. Here, at least a part of a concentration point may overlap another concentration point.

4.3 Effect

In the pulse stretcher 150 of the present embodiment as well, the number of overlapping beams of the pulse laser light is two at each of the concentration points 401, 403, 405. Therefore, the pulse laser light satisfying the performance required by the exposure apparatus 200 can be output, and a decrease in the reliability of the gas laser device 100 can be suppressed.

5. Description of Pulse Stretcher of Third Embodiment

Next, the configuration of the pulse stretcher 150 of a third embodiment will be described. Any component same as that described above is denoted by an identical reference sign, and duplicate description thereof is omitted unless specific description is needed.

5.1 Configuration

Figure 7:
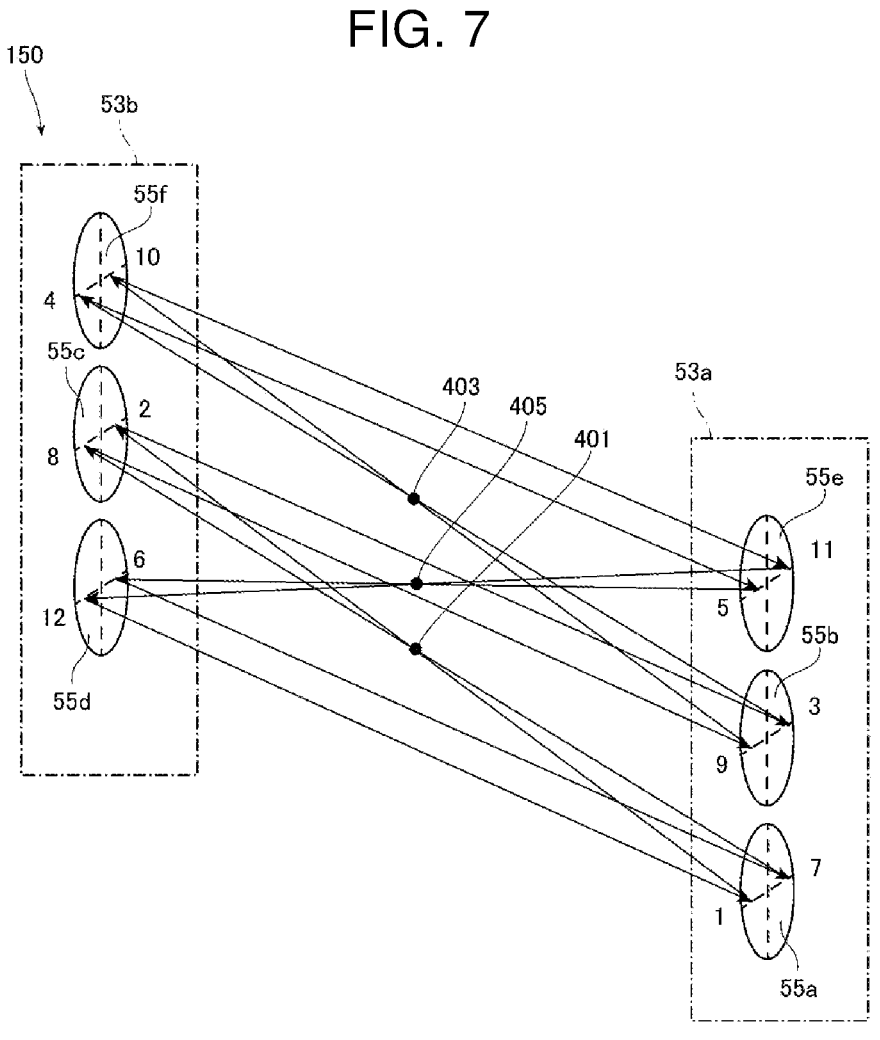
FIG. 7 is a diagram showing a schematic configuration example of the pulse stretcher, positions of reflection points 1 to 12, and reflection directions of the laser light in a third embodiment.

FIG. 7 is a diagram showing a schematic configuration example of the pulse stretcher 150, positions of reflection points 1 to 12, and reflection directions of the pulse laser light in the present embodiment. For ease of viewing, FIG. 7 does not show the beam splitter 51, the pulse laser light traveling from the output coupling mirror 147 to the beam splitter 51, and the pulse laser light traveling from the beam splitter 51 to the beam splitter 163. In the pulse stretcher 150 of the present embodiment, a concave mirror 55e as the first concave mirror is further provided on the first mirror unit 53a of the second embodiment, and a concave mirror 55f as the second concave mirror is further provided on the second mirror unit 53b thereof. Therefore, the pulse stretcher 150 of the present embodiment differs from the pulse stretcher 150 of the second embodiment in that each of the first mirror unit 53a and the second mirror unit 53b has three concave mirrors.

In the first mirror unit 53a, the concave mirrors 55a, 55b, 55e are arranged in this order in the predetermined direction, and in the second mirror unit 53b, the concave mirrors 55d, 55c, 55f are arranged in this order in the predetermined direction, and the concave mirror 55f faces the concave mirror 55e. With the arrangement of the concave mirrors 55e, 55f, the positions of the reflection points 1 to 12 and the reflection directions of the pulse laser lights change.

In the pulse stretcher 150 of the present embodiment, the positions of the reflection points 5, 11 are changed to the concave mirror 55e, and the positions of the reflection points 4, 10 are changed to the concave mirror 55f. The other reflection points 1 to 3, 6 to 9, 12 are located in the same position as in the second embodiment.

In the concave mirror 55e, the reflection point 5 is shifted from the reflection point 11 in the direction perpendicular to the predetermined direction, and is separated from the concave mirror 55b by the same distance as the reflection point 11. Further, in the concave mirror 55f, the reflection point 4 is shifted from the reflection point 10 in the direction perpendicular to the predetermined direction, and is separated from the concave mirror 55c by the same distance as the reflection point 10.

In the concave mirrors 55e, 55f, the reflection point 5, faces the reflection point 4 and the reflection point 11 faces the reflection point 10. A single plane passes through the reflection points 5, 11 of the concave mirror 55e and the reflection points 4, 10 of the concave mirror 55f.

In the present embodiment as well, the pulse laser light is reflected alternately by the first concave mirrors and the second concave mirrors during one cycle, and travels in order via the reflection points 1 to 12. Thus, in the pulse stretcher 150 of the present embodiment, the pulse laser light is reflected once during one cycle at each of two reflection points in each of the concave mirrors 55a to 55f. Further, as described above, the reflection points in each of the concave mirrors 55a to 55f are shifted in the direction perpendicular to the predetermined direction.

5.2 Operation

Operation of the pulse stretcher 150 in the present embodiment is the same as the operation of the second embodiment except that the pulse laser light is reflected at the reflection points 4, 5, 10, 11 of the concave mirrors 55e, 55f and is reflected once during one cycle at each of two reflection points in each of the concave mirrors 55a to 55f. Therefore, in the pulse stretcher 150 of the present embodiment as well, similarly to the pulse stretcher 150 of the second embodiment, three concentration points 401, 403, 405 are formed, and the number of overlapping beams of the pulse laser light at each of the concentration points 401, 403, 405 is two. Similarly to the pulse stretcher 150 of the second embodiment, the concentration points 401, 403, 405 are located at different positions in the predetermined direction.

Figure 8:
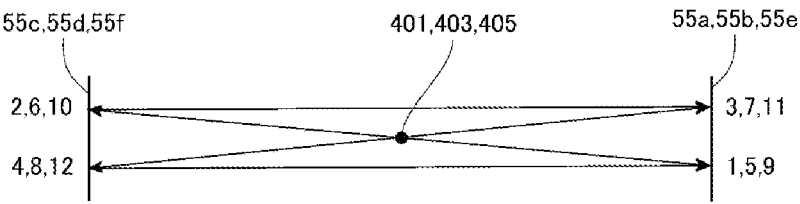
FIG. 8 is a diagram showing concave mirrors, the reflection points 1 to 12, and the reflection directions of the laser light shown in FIG. 7 along a predetermined direction.

FIG. 8 is a diagram showing the concave mirrors 55a to 55f, the reflection points 1 to 12, and the reflection directions of the pulse laser light shown in FIG. 7 along the predetermined direction. Similarly to the second embodiment, when the first mirror unit 53a and the second mirror unit 53b are viewed along the predetermined direction, the optical path of the pulse laser light passing through the concentration points 401, 403, 405 is two. Further, the concentration points 401, 403, 405 overlap each other. Here, at least a part of a concentration point may overlap another concentration point.

5.3 Effect

In the pulse stretcher 150 of the present embodiment, each of the first mirror unit 53a and the second mirror unit 53b has three concave mirrors. Then, the pulse laser light is reflected once during one cycle at each of two reflection points in each of the concave mirrors 55a to 55f.

According to the above configuration, since the positions of reflection are dispersed, heat concentration at the positions of reflection and temperature rise due to the heat concentration at the concave mirrors 55a to 55f can be suppressed. When the temperature rise is suppressed, deformation of the concave mirrors 55a to 55f can be suppressed, and distortion of the wavefront of the pulse laser light caused by the deformation can be suppressed. Therefore, the pulse laser light satisfying the performance required by the exposure apparatus 200 can be output, and a decrease in the reliability of the gas laser device 100 can be suppressed.

Figure 9:
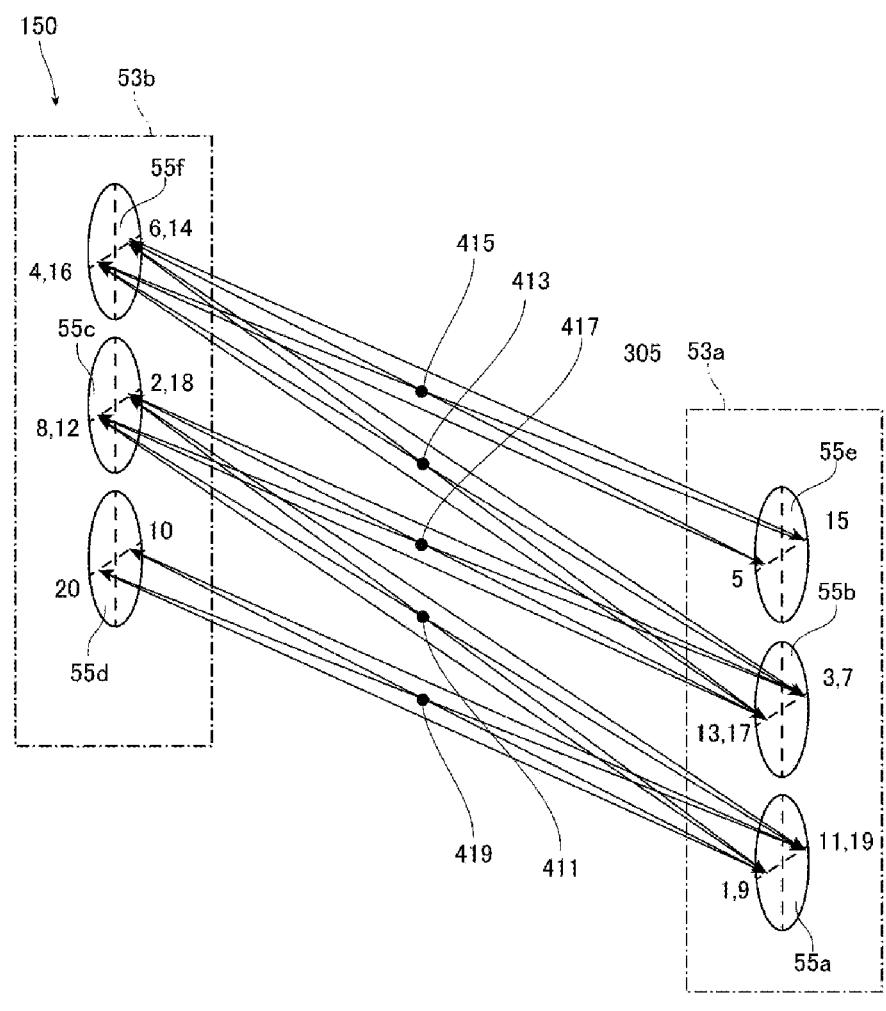
FIG. 9 is a diagram showing positions of reflection points 1 to 20 and reflection directions of the laser light in the pulse stretcher of a modification of the third embodiment.

Next, a modification of the present embodiment will be described. FIG. 9 is a diagram showing positions of reflection points 1 to 20 and reflection directions of the pulse laser light in the pulse stretcher 150 of the present modification. For easy viewing, FIG. 9 does not show the beam splitter 51, the pulse laser light traveling from the output coupling mirror 147 to the beam splitter 51, and the pulse laser light traveling from the beam splitter 51 to the beam splitter 163. The pulse stretcher 150 of the present modification differs from the pulse stretcher 150 of the third embodiment in that the pulse laser light is reflected by the concave mirrors 55a to 55f 20 times during one cycle. Therefore, in the pulse stretcher 150 of the present modification, the reflection points 1 to 20 are provided, and the pulse laser light is reflected alternately by the first concave mirrors and the second concave mirrors, and travels in order via the reflection points 1 to 20.

In the present modification, the reflection points 1, 9, 11, 19 are located on the concave mirror 55a, the reflection points 3, 7, 13, 17 are located on the concave mirror 55b, and the reflection points 5, 15 are located on the concave mirror 55e. Further, the reflection points 4, 6, 14, 16 are located on the concave mirror 55f, the reflection points 2, 8, 12, 18 are located on the concave mirror 55c, and the reflection points 10, 20 are located on the concave mirror 55d.

In the concave mirror 55a, the reflection point 1 is located at the same position as the reflection point 9, and the reflection point 11 is located at the same position as the reflection point 19. Further, the reflection points 1, 9 are shifted from the reflection points 11, 19 in the direction perpendicular to the predetermined direction, and are separated from the concave mirror 55b by the same distance as the reflection points 11, 19.

In the concave mirror 55b, the reflection point 3 is located at the same position as the reflection point 7, and the reflection point 13 is located at the same position as the reflection point 17. Further, the reflection points 3, 7 are shifted from the reflection points 13, 17 in the direction perpendicular to the predetermined direction, and are separated from the concave mirrors 55a, 55e by the same distance as the reflection points 11, 19.

In the concave mirror 55e, the reflection point 5 is shifted from the reflection point 15 in the direction perpendicular to the predetermined direction, and is separated from the concave mirror 55b by the same distance as the reflection point 15.

In the concave mirror 55f, the reflection point 4 is located at the same position as the reflection point 16, and the reflection point 6 is located at the same position as the reflection point 14. Further, the reflection points 4, 16 are shifted from the reflection points 6, 14 in the direction perpendicular to the predetermined direction, and are separated from the concave mirror 55c by the same distance as the reflection points 6, 14.

In the concave mirror 55c, the reflection point 2 is located at the same position as the reflection point 18, and the reflection point 8 is located at the same position as the reflection point 12. Further, the reflection points 2, 18 are shifted from the reflection points 8, 12 in the direction perpendicular to the predetermined direction, and are separated from the concave mirrors 55d, 55f by the same distance as the reflection points 8, 12.

In the concave mirror 55d, the reflection point 10 is shifted from the reflection point 20 in the direction perpendicular to the predetermined direction, and is separated from the concave mirror 55c by the same distance as the reflection point 20.

In the concave mirrors 55a, 55d, the reflection points 1, 9 face the reflection point 20 and the reflection points 11, 19 face the reflection point 10. In the concave mirrors 55b, 55c, the reflection points 13, 17 face the reflection points 8, 12 and the reflection points 3, 7 face the reflection points 2, 18. In the concave mirrors 55e, 55f, the reflection point 5 faces the reflection points 4, 16 and the reflection point 15 faces the reflection points 6, 14. A single plane passes through the reflection points 1, 9, 11, 19 of the concave mirror 55a and the reflection points 10, 20 of the concave mirror 55d. Further, a single plane passes through the reflection points 3, 7, 13, 17 of the concave mirror 55b and the reflection points 2, 8, 12, 18 of the concave mirror 55c, and a single plane passes through the reflection points 5, 15 of the concave mirror 55e and the reflection points 4, 6, 14, 16 of the concave mirror 55f. When the concave mirrors 55a, 55b, 55e are viewed along a predetermined direction, in the concave mirrors 55a, 55b, 55e, the reflection points 1, 5, 9, 13, 17 overlap each other, and the reflection points 3, 7, 11, 15, 19 overlap each other. Further, in the concave mirrors 55c, 55d, 55f, the reflection points 2, 6, 10, 14, 18 overlap each other, and the reflection points 4, 8, 12, 16, 20 overlap each other.

In the pulse stretcher 150 of the present modification, at least a part of each beam of the pulse laser light overlaps at the beam waist of the pulse laser light traveling from the reflection point 1 to the reflection point 2 and at the beam waist of the pulse laser light traveling from the reflection point 11 to the reflection point 12, and a concentration point 411 is formed. Further, at least a part of each beam of the pulse laser light overlaps at the beam waist of the pulse laser light traveling from the reflection point 3 to the reflection point 4 and at the beam waist of the pulse laser light traveling from the reflection point 13 to the reflection point 14, and a concentration point 413 is formed. Further, at least a part of each beam of the pulse laser light overlap at the beam waist of the pulse laser light traveling from the reflection point 5 to the reflection point 6 and at the beam waist of the pulse laser light traveling from the reflection point 15 to the reflection point 16, and a concentration point 415 is formed. Further, at least a part of each beam of the pulse laser light overlap at the beam waist of the pulse laser light traveling from the reflection point 7 to the reflection point 8 and at the beam waist of the pulse laser light traveling from the reflection point 17 to the reflection point 18, and a concentration point 417 is formed. Further, at least a part of each beam of the pulse laser light overlap at the beam waist of the pulse laser light traveling from the reflection point 9 to the reflection point 10 and at the beam waist of the pulse laser light traveling from the reflection point 19 to the reflection point 20, and a concentration point 419 is formed.

Thus, in the pulse stretcher 150 of the present modification, five concentration points 411, 413, 415, 417, 419 are formed, and the number of overlapping beams of the pulse laser light at each of the concentration points 411, 413, 415, 417, 419 is two. The concentration points 411, 413, 415, 417, 419 are located at different positions in the predetermined direction. When the first mirror unit 53a and the second mirror unit 53b are viewed along the predetermined direction, a number of optical paths of the pulse laser light passing through the concentration points 411, 413, 415, 417, 419 is two. Further, the concentration points 411, 413, 415, 417, 419 overlap each other. Here, at least a part of a concentration point may overlap another concentration point.

6. Description of Pulse Stretcher of Fourth Embodiment

Next, the configuration of the pulse stretcher 150 of a fourth embodiment will be described. Any component same as that described above is denoted by an identical reference sign, and duplicate description thereof is omitted unless specific description is needed.

6.1 Configuration

Figures 10, 11:
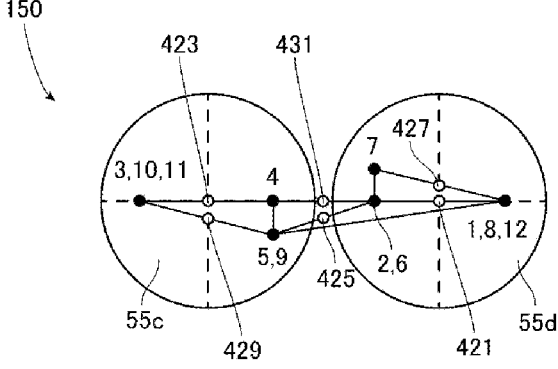
FIG. 10 is a schematic perspective diagram showing positional relationship of reflection points 1 to 12 in concave mirrors of a fourth embodiment.
FIG. 11 is an explanatory diagram of positions of beam waists of the laser light in the fourth embodiment.

FIG. 10 is a schematic perspective diagram showing the positional relationship of reflection points 1 to 12 in the concave mirrors 55a to 55d of the present embodiment. For easy viewing, FIG. 10 does not show the beam splitter 51, the pulse laser light traveling from the output coupling mirror 147 to the beam splitter 51, and the pulse laser light traveling from the beam splitter 51 to the beam splitter 163. The configuration of the pulse stretcher 150 of the present embodiment is the same as the configuration of the pulse stretcher 150 of the first embodiment, and the same applies to the reflection points 1 to 12 located at the respective concave mirrors 55a to 55d. However, in the pulse stretcher 150 of the present embodiment, one concave mirror is shifted about an axis perpendicular to the arrangement direction of the concave mirrors with respect to the first embodiment so that the beam waists of the pulse laser light are shifted from each other. In the present embodiment, an example in which the concave mirror 55c, being one in the second mirror unit 53b, reflecting the pulse laser light twice is shifted will be described.

The concave mirror 55c of the present embodiment is shifted about the axis perpendicular as described above, as the travel direction of the pulse laser light is returned to the original while the reflection directions of the pulse laser light at the reflection points 4, 10 are changed and the change of the reflection angle is canceled by the reflection at the reflection point 10. When the concave mirror 55c is shifted, the reflection points 5, 9 are lowered compared with the reflection point 4 and the reflection point 7 is raised compared with the reflection points 2, 6, in the direction perpendicular to the predetermined direction. Even when the concave mirror 55c is shifted, the reflection points 1 to 4, 6, 8, 10 to 12 other than the reflection points 5, 7, 9 are not shifted. FIG. 11 is an explanatory diagram of the positions of the beam waists of the pulse laser light when the concave mirrors 55a, 55b are viewed from the concave mirrors 55c, 55d of the present embodiment.

In FIG. 11, the reflection points 1 to 12 are indicated by black circles, and the beam waists are indicated by white circles. When the concave mirror 55c is shifted as described above, a beam waist 425 of the pulse laser light traveling from the reflection point 5 to the reflection point 6 is lowered from a beam waist 431 of the pulse laser light traveling from the reflection point 11 to the reflection point 12. A beam waist 427 of the pulse laser light traveling from the reflection point 7 to the reflection point 8 is raised from a beam waist 421 of the pulse laser light traveling from the reflection point 1 to the reflection point 2. Further, a beam waist 429 of the pulse laser light traveling from the reflection point 9 to the reflection point 10 is lowered from a beam waist 423 of the pulse laser light traveling from the reflection point 3 to the reflection point 4. Therefore, the beam waists 421, 423, 425,

427, 429, 431 do not overlap each other due to the shift of the concave mirror 55c being one in the second mirror unit 53b.

6.2 Effect

According to the configuration described above, the beam waists 421, 423, 425, 427, 429, 431 are shifted from each other. Therefore, the energy of the pulse laser light absorbed by oxygen becomes smaller than that when the beam waists 421, 423, 425, 427, 429, 431 overlap. Consequently, the temperature rise and the generation of plasma in the vicinity of the concentration point of the pulse stretcher 150 are suppressed. According to the suppression of the above, generation of the refractive index distribution in the pulse stretcher 150 is suppressed and distortion of the wavefront of the pulse laser light can be suppressed. Therefore, the pulse laser light that satisfies the performance required by the exposure apparatus 200 can be output, and a decrease in the reliability of the gas laser device 100 can be suppressed.

Figure 12:
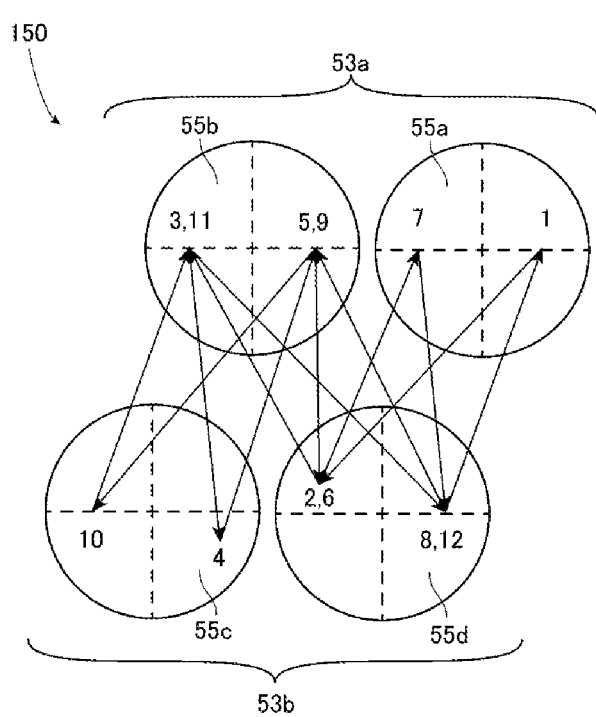
FIG. 12 is a schematic perspective diagram showing positional relationship of reflection points 1 to 12 in concave mirrors of a first modification of the fourth embodiment.

Next, as a first modification of the present embodiment, an example in which the concave mirror 55a, of the first mirror unit 53a, reflecting the pulse laser light twice is shifted will be described. FIG. 12 is a schematic perspective diagram showing the positional relationship of reflection points 1 to 12 in the concave mirrors 55a to 55d of the first modification. The concave mirror 55a is shifted about the axis perpendicular as described above, as the travel direction of the pulse laser light is returned to the original while the reflection directions of the pulse laser light at the reflection points 1, 7 are changed and the change of the reflection angle is canceled by the reflection at the reflection point 7. Due to the shift of the concave mirror 55a, in the direction perpendicular the predetermined direction, the reflection points 2, 6 are raised compared with the reflection point 7, and the reflection point 4 is lowered compared with the reflection points 5, 9. Even when the concave mirror 55a is shifted, the reflection points 1, 3, 5, 7 to 12 other than the reflection points 2, 4, 6 are not shifted.

Figure 13:
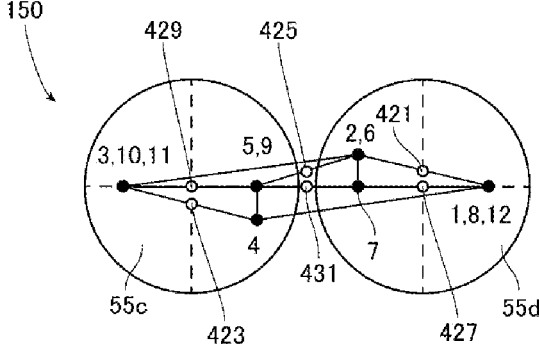
FIG. 13 is an explanatory diagram of positions of beam waists of the laser light of the first modification of the fourth embodiment.

FIG. 13 is an explanatory diagram of the positions of the beam waists of the pulse laser light when the concave mirrors 55a, 55b are viewed from the concave mirrors 55c, 55d of the present modification. When the concave mirror 55a is shifted as described above, a beam waist 421 of the pulse laser light traveling from the reflection point 1 to the reflection point 2 is raised from a beam waist 427 of the pulse laser light traveling from the reflection point 7 to the reflection point 8. A beam waist 425 of the pulse laser light traveling from the reflection point 5 to the reflection point 6 is raised from a beam waist 431 of the pulse laser light traveling from the reflection point 11 to the reflection point 12. Further, a beam waist 423 of the pulse laser light traveling from the reflection point 3 to the reflection point 4 is lowered from the beam waist 429 of the pulse laser light traveling from the reflection point 9 to the reflection point 10. Therefore, the beam waists 421, 423, 425, 427, 429, 431 do not overlap each other due to the shift of the concave mirror 55a being one in the first mirror unit 53a.

Figure 14:
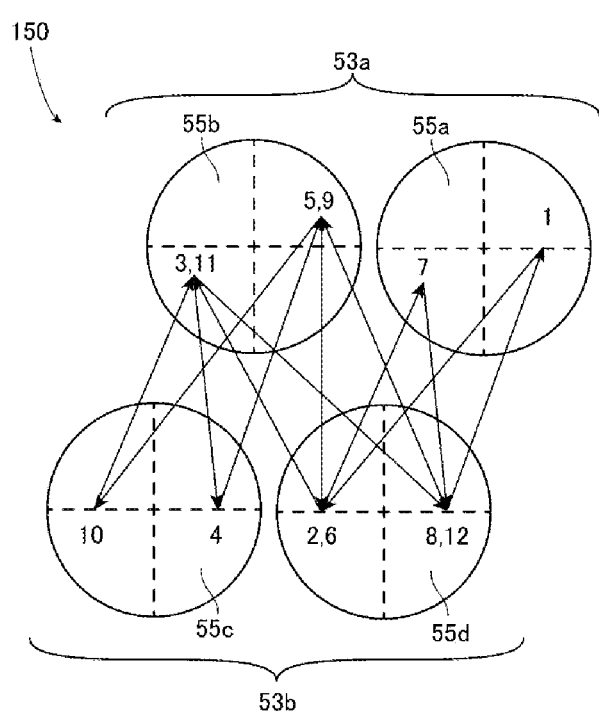
FIG. 14 is a schematic perspective diagram showing positional relationship of reflection points 1 to 12 in concave mirrors of a second modification of the fourth embodiment.

Next, a second modification of the present embodiment, an example in which the concave mirror 55d, of the second mirror unit 53b, reflecting the pulse laser light four times is shifted will be described. FIG. 14 is a schematic perspective diagram showing the positional relationship of reflection points 1 to 12 in the concave mirrors 55a to 55d of a second modification. The concave mirror 55d is shifted about the axis perpendicular as described above, as the travel direction of the pulse laser light is returned to the original while the reflection directions of the pulse laser light at the reflection points 2, 12 are changed and the change of the reflection angle is canceled by the reflection at the reflection point 12. Due to the shift of the concave mirror 55d, the reflection points 3, 11 are lowered compared with the reflection point 10, and the reflection point 7 is lowered compared with the reflection points 2, 6. Even when the concave mirror 55d is shifted, the reflection points 1, 2, 4, 6, 8, 10, 12 other than the reflection points 3, 5, 7, 9, 11 are not shifted.

Figure 15:
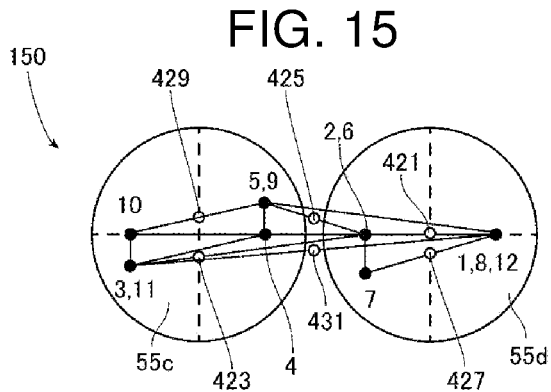
FIG. 15 is an explanatory view of positions of beam waists of the laser light of the second modification of the fourth embodiment.

FIG. 15 is an explanatory diagram of the positions of the beam waists of the pulse laser light when the concave mirrors 55a, 55b are viewed from the concave mirrors 55c, 55d. When the concave mirror 55d is shifted as described above, a beam waist 423 of the pulse laser light traveling from the reflection point 3 to the reflection point 4 is lowered, and a beam waist 429 of the pulse laser light traveling from the reflection point 9 to the reflection point 10 is raised. Further, a beam waist 425 of the pulse laser light traveling from the reflection point 5 to the reflection point 6 is raised, and a beam waist 431 of the pulse laser light traveling from the reflection point 11 to the reflection point 12 is lowered. Further, a beam waist 427 of the pulse laser light traveling from the reflection point 7 to the reflection point 8 is lowered from the beam waist 421 of the pulse laser light traveling from the reflection point 1 to the reflection point 2. Therefore, the beam waists 421, 423, 425, 427, 429, 431 do not overlap each other due to the shift of the concave mirror 55d being the other in the second mirror unit 53b.

The description above is intended to be illustrative and the present disclosure is not limited thereto. Therefore, it would be obvious to those skilled in the art that various modifications to the embodiment of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A pulse stretcher comprising:
a beam splitter configured to split pulse laser light into two beams of pulse laser light;
a plurality of first concave mirrors arranged side by side in a predetermined direction; and
a plurality of second concave mirrors arranged side by side in the predetermined direction as having the same number as the first concave mirrors and facing the first concave mirrors, respectively, wherein
the plurality of first concave mirrors and the plurality of second concave mirrors are configured such that one beam of pulse laser light split by the beam splitter is alternately reflected 12 times prior to returning to the beam splitter,
the plurality of first concave mirrors and the plurality of second concave mirrors are configured such that a number of optical paths of the beam of pulse laser light that overlap at each of a plurality of concentration point is only two, a number of the plurality of first concave mirrors is three, and a number of the plurality of second concave mirrors is also three, and
the one beam of pulse laser light is reflected once at each of two reflection points in each of the three first concave mirrors and the three second concave mirrors, during one cycle in which the one beam of pulse laser light travels from the beam splitter back to the beam splitter via the plurality of first concave mirrors and the plurality of second concave mirrors.

2. The pulse stretcher according to claim 1,
wherein the first concave mirrors and the second concave mirrors each have the same radius of curvature.

3. The pulse stretcher according to claim 2,
wherein a distance between a concave mirror of the first concave mirrors and a concave mirror of the second concave mirrors, the concave mirrors facing each other, is equal to the radius of curvature.

4. The pulse stretcher according to claim 1,
wherein a number of the first concave mirrors is two and a number of the second concave mirrors is two,
the one beam of pulse laser light is reflected once at each of two reflection points in each of one of the first concave mirrors and one of the second concave mirrors, during one cycle in which the one beam of pulse laser light travels from the beam splitter back to the beam splitter via the plurality of first concave mirrors and the plurality of second concave mirrors, and
the one beam of pulse laser light is reflected twice at each of two reflection points in each of the other of the first concave mirrors and the other of the second concave mirrors during the one cycle.

5. The pulse stretcher according to claim 4,
wherein a number of the light concentration points is three.

6. The pulse stretcher according to claim 1,
wherein a single plane passes through the reflection points in the first concave mirrors and the reflection points in the second concave mirrors.

7. The pulse stretcher according to claim 1,
wherein the reflection points in each of the first concave mirrors are shifted from each other in a direction perpendicular to the predetermined direction, and the reflection points in each of the second concave mirrors are shifted in a direction perpendicular to the predetermined direction.

8. The pulse stretcher according to claim 7,
wherein the concentration points are located at different positions in the predetermined direction.

9. The pulse stretcher according to claim 7,
wherein, when the plurality of first concave mirrors and the plurality of second concave mirrors are viewed along the predetermined direction in which the plurality of first concave mirrors are arranged, a number of optical paths of the one beam of pulse laser light passing through the concentration points is two.

10. The pulse stretcher according to claim 1,
wherein a number of the light concentration points is three.

11. An electronic device manufacturing method comprising:
generating laser light using a gas laser device including a pulse stretcher;
outputting the laser light to an exposure apparatus; and
exposing a photosensitive substrate to the laser light in the exposure apparatus to manufacture an electronic device, the pulse stretcher including:

a beam splitter configured to split pulse laser light into two beams of pulse laser light;

a plurality of first concave mirrors arranged side by side in a predetermined direction; and a plurality of second concave mirrors arranged side by side in the predetermined direction as having the same number as the first concave mirrors and facing the first concave mirrors, respectively, wherein the plurality of first concave mirrors and the plurality of second concave mirrors are configured such that one beam of pulse laser light split by the beam splitter is alternately reflected 12 times prior to returning to the beam splitter, the plurality of first concave mirrors and the plurality of second concave mirrors are configured such that a number of optical paths of the beam of pulse laser light that overlap at each of a plurality of concentration point is only two, a number of the plurality of first concave mirrors is three, and a number of the plurality of second concave mirrors is also three, and the one beam of pulse laser light is reflected once at each of two reflection points in each of the three first concave mirrors and the three second concave mirrors, during one cycle in which the one beam of pulse laser light travels from the beam splitter back to the beam splitter via the plurality of first concave mirrors and the plurality of second concave mirrors.

* * * * *